United States Patent
Yang et al.

(10) Patent No.: US 6,987,311 B2
(45) Date of Patent: Jan. 17, 2006

(54) THIN FILM TRANSISTORS OF A THIN FILM TRANSISTOR LIQUID CRYSTAL DISPLAY AND METHOD FOR FABRICATING THE SAME

(75) Inventors: Chung-Hsien Yang, Tainan Hsien (TW); Rung-Nan Lu, Tainan Hsien (TW)

(73) Assignee: Chi Mei Optoelectronics Corporation, Tainan (TW)

( * ) Notice: Subject to any disclaimer, the term of this patent is extended or adjusted under 35 U.S.C. 154(b) by 28 days.

(21) Appl. No.: 10/250,017

(22) Filed: May 28, 2003

(65) Prior Publication Data

US 2003/0232456 A1   Dec. 18, 2003

(30) Foreign Application Priority Data

May 28, 2002   (TW) ............................... 91111376 A

(51) Int. Cl.
*H01L 23/552*   (2006.01)
(52) U.S. Cl. .................. 257/659; 257/411; 257/59; 257/72
(58) Field of Classification Search .............. 257/347, 257/350, 59, 61, 72, 411, 532, 659, 435; 438/158
See application file for complete search history.

(56) References Cited

U.S. PATENT DOCUMENTS

| | | | |
|---|---|---|---|
| 5,060,036 A * | 10/1991 | Choi | 257/350 |
| 5,153,690 A * | 10/1992 | Tsukada et al. | 257/61 |
| 5,510,916 A | 4/1996 | Takahashi | |
| 5,668,649 A | 9/1997 | Suzuki et al. | |
| 5,844,255 A | 12/1998 | Suzuki et al. | |
| 6,100,954 A * | 8/2000 | Kim et al. | 349/138 |
| 6,243,146 B1 * | 6/2001 | Rho et al. | 349/42 |
| 6,335,540 B1 * | 1/2002 | Zhang | 257/53 |
| 6,812,986 B2 * | 11/2004 | Takatori et al. | 349/141 |
| 2003/0232456 A1 * | 12/2003 | Yang et al. | 438/30 |

* cited by examiner

*Primary Examiner*—Mark V. Prenty
(74) *Attorney, Agent, or Firm*—Winston Hsu

(57) ABSTRACT

A method for fabricating thin film transistors (TFT) of a TFT-LCD. The method first forms a gate electrode of the TFT in a transistor area of a substrate. Then a first dielectric layer, a light shielding layer, a second dielectric layer, a semiconductor layer, a doped silicon conductive layer and a second metal layer are sequentially formed on the gate electrode so as to form the TFT in the transistor area. A channel area is defined in the TFT for separating the second metal layer and the doped silicon conductive layer so as to respectively form a source electrode and a drain electrode of the TFT. Finally, a passivation layer and a transparent conductive layer are sequentially formed on the drain electrode, and the transparent conductive layer is connected with the drain electrode through a first via hole of the passivation layer.

10 Claims, 20 Drawing Sheets

THIN FILM TRANSISTORS OF A THIN FILM TRANSISTOR LIQUID CRYSTAL DISPLAY AND METHOD FOR FABRICATING THE SAME

BACKGROUND OF INVENTION

1. Field of the Invention

The present invention relates to a thin film transistor of a TFT-LCD and a method for fabricating the same, and more particularly, to a fabrication method of thin film transistors using four photolithography-etching processes (4 PEP).

2. Description of the Prior Art

A thin film transistor liquid crystal display (TFT-LCD) utilizes many thin film transistors arranged in a matrix as switches for driving liquid crystal molecules to produce brilliant images after cooperating with other elements such as capacitors and bonding pads. The advantages of the TFT-LCD include portability, low power consumption, and low radiation. Therefore, the TFT-LCD is widely used in various portable products, such as notebooks, personal data assistants (PDA), etc. Moreover, the TFT-LCD replaces the CRT monitor in desktop computers gradually.

When simplifying the process for fabricating TFT-LCDs, a fabrication process of the TFT-LCD using only four photolithography-etching processes (4 PEP) is widely applied. Please refer to FIG. 1 to FIG. 6 of schematic diagrams of a 4 PEP fabrication process of a TFT-LCD according to a prior art method. As shown in FIG. 1, the TFT-LCD is fabricated on a surface of a glass substrate 10, and the surface of the substrate 10 comprises a transistor area 13, a capacitor area 14, a first conductive line area 11 and a second conductive line area 12, therein the first conductive line area 11 could be a scan line and the second conductive line area 12 could be a data line. The process first forms a first metal layer (not shown) on the surface of the substrate 10, and then a first PEP is performed to define a pattern of the first metal layer so as to form a first conductive line 20, a gate electrode 16 of a thin film transistor, and a capacitor bottom electrode 18, respectively, in the first conductive line area 11, in the transistor area 13 and in the capacitor area 14.

As shown in FIG. 2, an insulating layer 22, a semiconductor layer 24, a doped silicon layer 26, and a second metal layer 28 are sequentially formed on the surface of the substrate 10 covering the patterned first metal layer. Then, as shown in FIG. 3, a photoresist layer 30 is formed on the surface of the substrate 10, and a second PEP is performed to remove a portion of the second metal layer 28, the doped silicon layer 26, and the semiconductor layer 24 not covered by the photoresist layer 30 until a surface of the insulating layer 22 is exposed. Consequently, a second conductive line 21, the thin film transistor, and the capacitor are formed, respectively, in the second conductive line area 12, in the capacitor area 13, and in the capacitor area 14. Simultaneously, the second metal layer 28, the doped silicon layer 26, and the semiconductor layer 24 in the first conductive line area 11 are removed. Therein, the second metal layer 28 is a capacitor top electrode.

As shown in FIG. 4, an ashing process is performed to remove a portion of the photoresist layer 30 so as to define a channel area 31 of the thin film transistor. The remaining photoresist layer is used as a mask to remove the second metal layer 28 and the doped silicon layer 26 within the channel area 31. Consequently, the channel area 31 separates both the second metal layer 28 and the doped silicon layer 26 into two sides, and the two sides of the second metal layer 28 and the doped silicon layer 26 are respectively used as a source electrode 32 and a drain electrode 34 of the thin film transistor. After that, as shown in FIG. 5, a stripping process is performed to completely remove the remaining photoresist layer, and then a passivation layer 36 is formed on the surface of the substrate 10. A third PEP is performed to form a first contact hole 40 in the passivation layer 36 positioned above the drain electrode 34, a second contact hole 41 in the passivation layer 36 positioned above the capacitor top electrode, a third contact hole 42 in the passivation layer 36 positioned above the second metal layer 28 of the second conductive line area 12, and a fourth contact hole 43 in both the passivation layer 36 and the insulating layer 22 of the first conductive line area 11, respectively. Therefore, a portion of the drain electrode 34, a portion of the capacitor top electrode, a portion of the second conductive line 21, and a portion of the first conductive line 20 are exposed because of the formation of the contact holes 40, 41, 42, 43.

Finally, as shown in FIG. 6, a fourth PEP is performed to simultaneously form a patterned transparent conductive layer 44 on a surface of the passivation layer 36 positioned above the drain electrode 34, on a surface of the passivation layer 36 positioned above the capacitor top electrode, on a surface of the passivation layer 36 of the second conductive line area 12, and on a surface of the passivation layer 36 and the first insulating layer 22 of the first conductive line area 11. Furthermore, the transparent conductive layer 44 is connected with the drain electrode 34, the capacitor top electrode, the second conductive line 21, and the first conductive line 20, respectively, through the first contact hole 40, the second contact hole 41, the third contact hole 42, and the fourth contact hole 43. The fabrication process of the TFT-LCD according to the prior art method only uses four photolithography etching processes and substantially simplifies the fabrication process, however, the second metal layer 28 and the semiconductor layer 24 are simultaneously formed by performing the second PEP according to the prior art method. In detail, the pattern of the semiconductor layer 24 is the same as the second metal layer 28, as shown in FIG. 6, and the semiconductor layer is formed under the second metal layer 28. Consequently, when back light of the TFT-LCD passes through a polarizer (not shown in FIG. 6), the substrate 10, and the insulating layer 22 and directly illuminates the semiconductor layer 24 of the thin film transistor not covered by the gate electrode 16 within the transistor area, thin film transistors of the TFT-LCD fabricated according to the prior art method produce photo induced leakage current, which critically affects the reliability of products.

SUMMARY OF INVENTION

It is therefore an objective of the claimed invention to provide a method for fabricating thin film transistors of a TFT-LCD for solving the above-mentioned problems.

The TFT-LCD of the present invention comprises first forming a gate electrode of the TFT in a transistor area of a substrate. Then a first dielectric layer, a light shielding layer, a second dielectric layer, a semiconductor layer, a doped silicon conductive layer and a second metal layer are sequentially formed on the gate electrode so as to form the TFT in the transistor area. A channel area is defined in the TFT for separating the second metal layer and the doped silicon conductive layer so as to respectively form a source electrode and a drain electrode of the TFT. Finally, a passivation layer and a transparent conductive layer are sequentially formed on the drain electrode, and the transparent conductive layer is electrically connected with the drain electrode through a first via hole of the passivation layer.

The present invention method for fabricating a thin film transistor comprises forming a first metal layer on a surface of the substrate in a transistor area and defining a pattern of the first metal layer in the transistor area so as to form a gate electrode of the thin film transistor. A first insulating layer, a light shielding layer, a second insulating layer, a semiconductor layer, a doped silicon layer, and a second metal layer, are respectively formed on the surface of the substrate covering the gate electrode. After that, a photoresist layer is formed on a surface of the second metal layer, and a pattern of the photoresist layer comprises a first portion having a first thickness opposite to a channel area, a second portion having a second thickness greater than the first thickness, and a third portion substantially having no photoresist. Then the second metal layer, the doped silicon layer, the semiconductor layer, the second insulating layer, and the light shielding layer under the third portion of the photoresist layer are sequentially removed. The photoresist layer in the first portion is removed so as to define the channel area of the thin film transistor, and the second metal layer and the doped silicon layer within the channel area are removed, therefore, the second metal layer and the doped silicon layer separated by the channel area are respectively used as a source electrode and a drain electrode of the thin film transistor. Finally, the photoresist layer in the second portion is removed.

The present invention method for fabricating a thin film transistor comprises forming a first metal layer on a surface of the substrate in a transistor area and defining a pattern of the first metal layer in the transistor area so as to form a gate electrode of the thin film transistor. A first insulating layer, a light absorbing insulating layer, a semiconductor layer, a doped silicon layer, and a second metal layer, are respectively formed on the surface of the substrate covering the gate electrode. After that, a photoresist layer is formed on a surface of the second metal layer, and a pattern of the photoresist layer comprises a first portion having a first thickness opposite to a channel area, a second portion having a second thickness greater than the first thickness, and a third portion substantially having no photoresist. Then the second metal layer, the doped silicon layer, the semiconductor layer, the second insulating layer, and the light absorbing insulating layer under the third portion of the photoresist layer are sequentially removed. The photoresist layer in the first portion is removed so as to define the channel area of the thin film transistor, and the second metal layer and the doped silicon layer within the channel area are removed, therefore, the second metal layer and the doped silicon layer separated by the channel area are respectively used as a source electrode and a drain electrode of the thin film transistor. Finally, the photoresist layer in the second portion is removed.

The fabrication process of thin film transistors according to the claimed invention forms a light shielding layer between the gate electrode and the semiconductor layer of the thin film transistors. The light shielding layer and the semiconductor layer are simultaneously defined by the second photolithography-etching process, therefore, the light shielding layer (or the light absorbing insulating layer) must be formed under the pattern of the semiconductor layer so as to prevent the semiconductor layer from being directly exposed to back light. That is, the light shielding layer is used for blocking or absorbing back light of the TFT-LCD. Consequently, the thin film transistors are effectively prevented from producing photo induced leakage current, or photo induced leakage current produced from the thin film transistor are effectively reduced.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
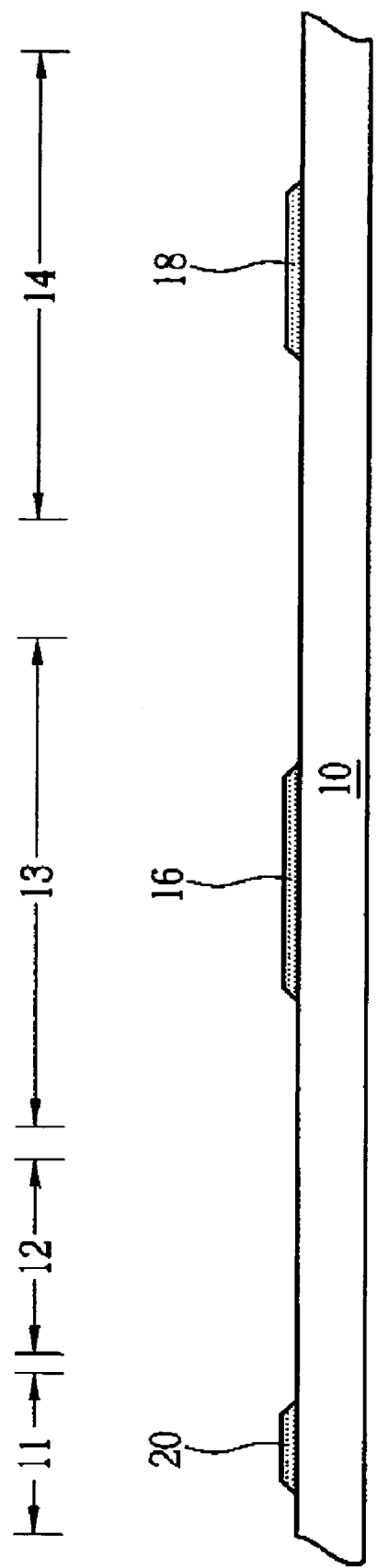
FIG. 1 to FIG. 6 are schematic diagrams of a prior art fabrication process of a TFT-LCD using 4 PEP.
Figure 2:
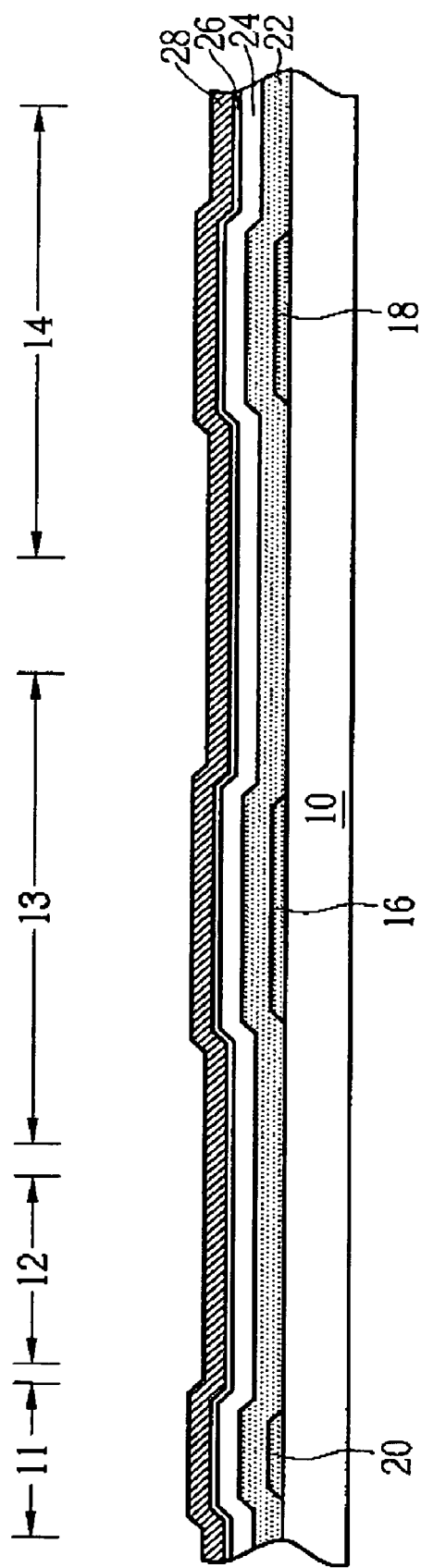
Figure 3:
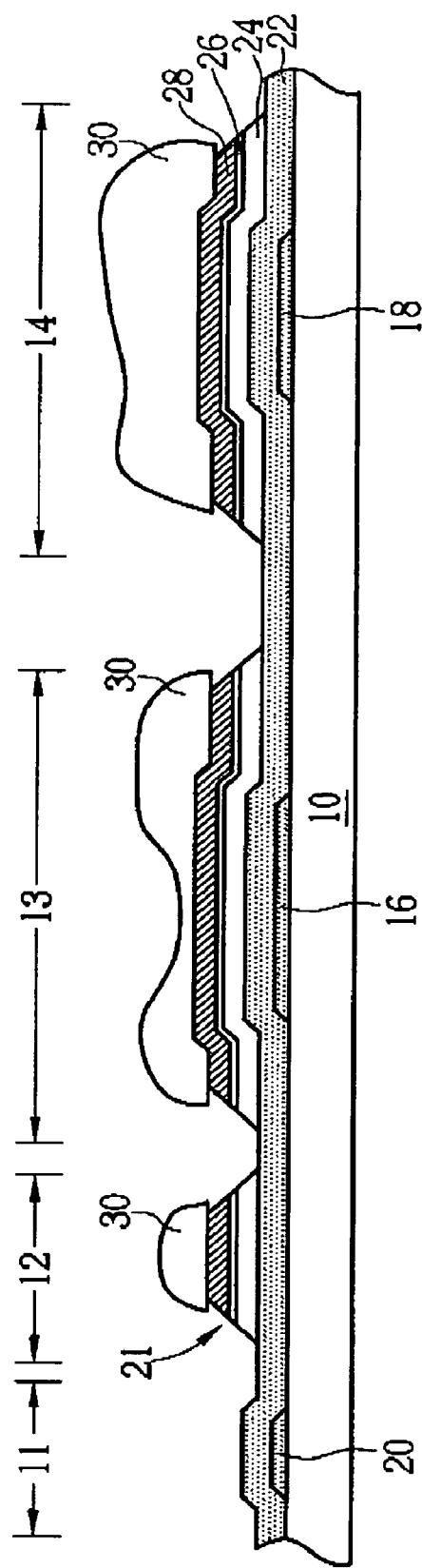
Figure 4:
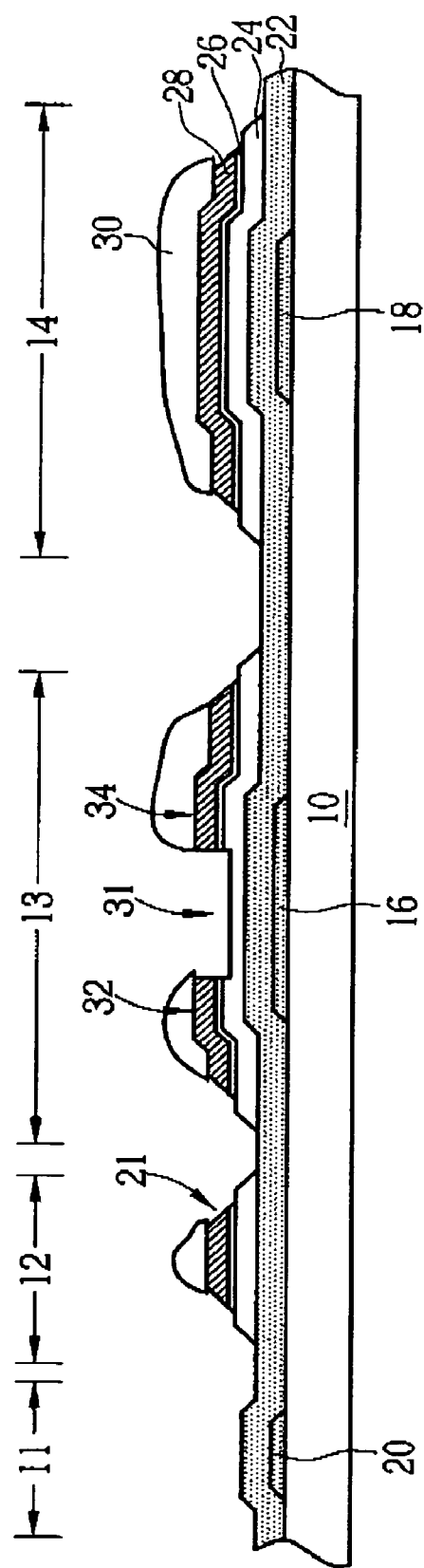
Figure 5:
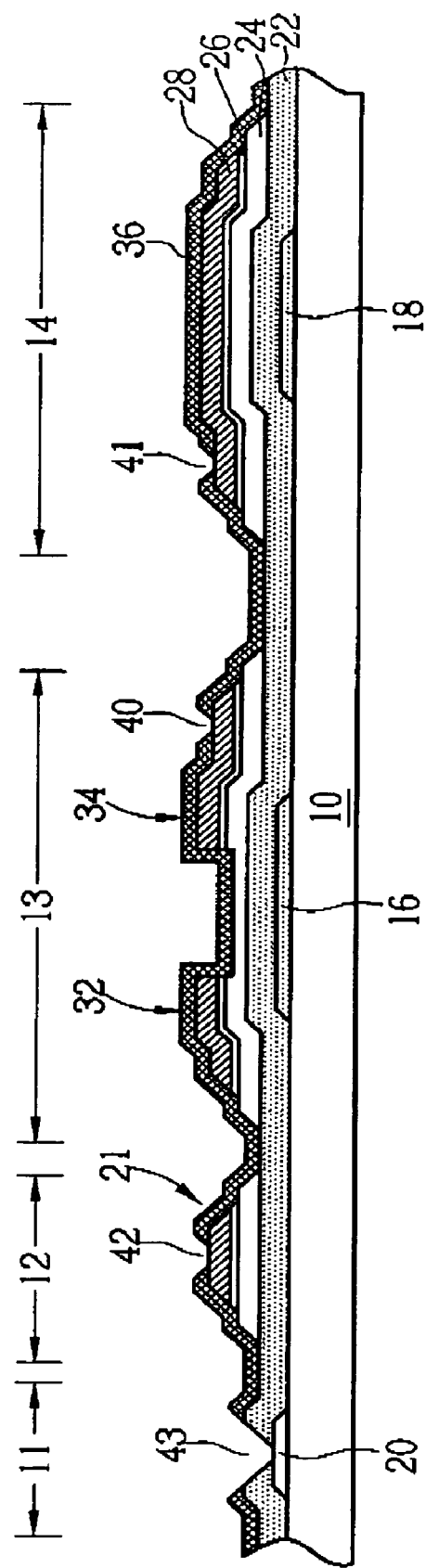
Figure 6:
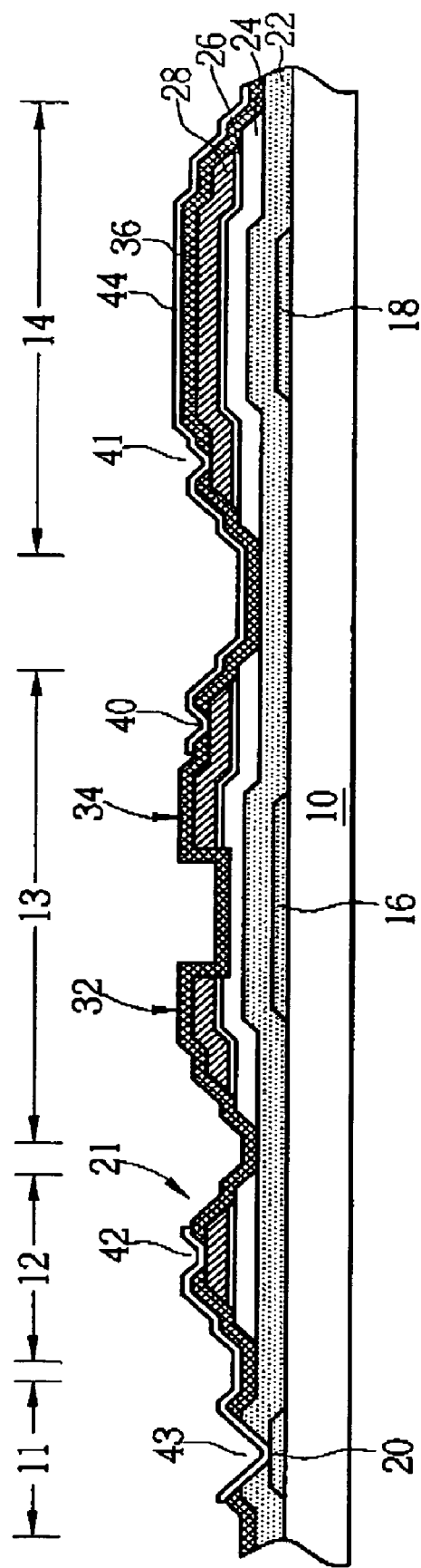
Figure 7:
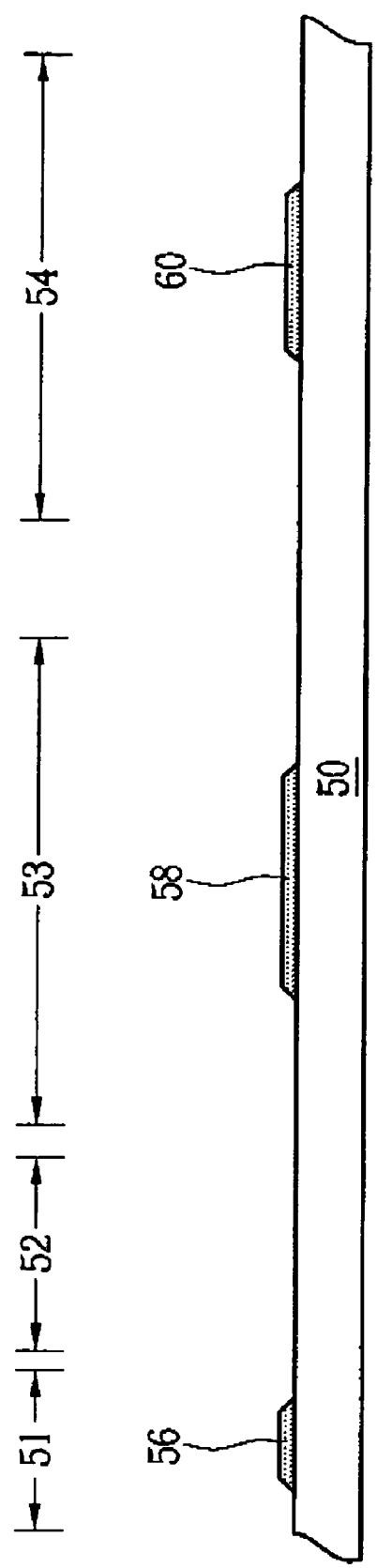
FIG. 7 to FIG. 12 are schematic diagrams of a fabrication process of thin film transistors of a TFT-LCD according to a first embodiment of the present invention.

Please refer to FIG. 7 to FIG. 12 of schematic diagrams of a fabrication process of thin film transistors of a TFT-LCD according to a first embodiment of the present invention. As shown in FIG. 7, the TFT-LCD is fabricated on a surface of a glass substrate 50, and the surface of the substrate 50 comprises a transistor area 53, a capacitor area 54, a first conductive line area 51 and a second conductive line area 52. The process according to the present invention first forms a first metal layer (not shown) on the surface of the substrate 50. A first photolithography process is then performed to define a pattern of the first metal layer in the transistor area 53, and respectively define a capacitor and a first conductive line 56 in the capacitor area 54 and in the first conductive line area 51. After that, an etching process is performed to form a gate electrode 58 of a thin film transistor, a capacitor bottom electrode 60 and a first conductive line 56, respectively, in the transistor area 53, in the capacitor area 54 and in the first conductive line area 51. Simultaneously, the first metal layer in the second conductive line area 52 is removed by the etching process.

Figure 8:
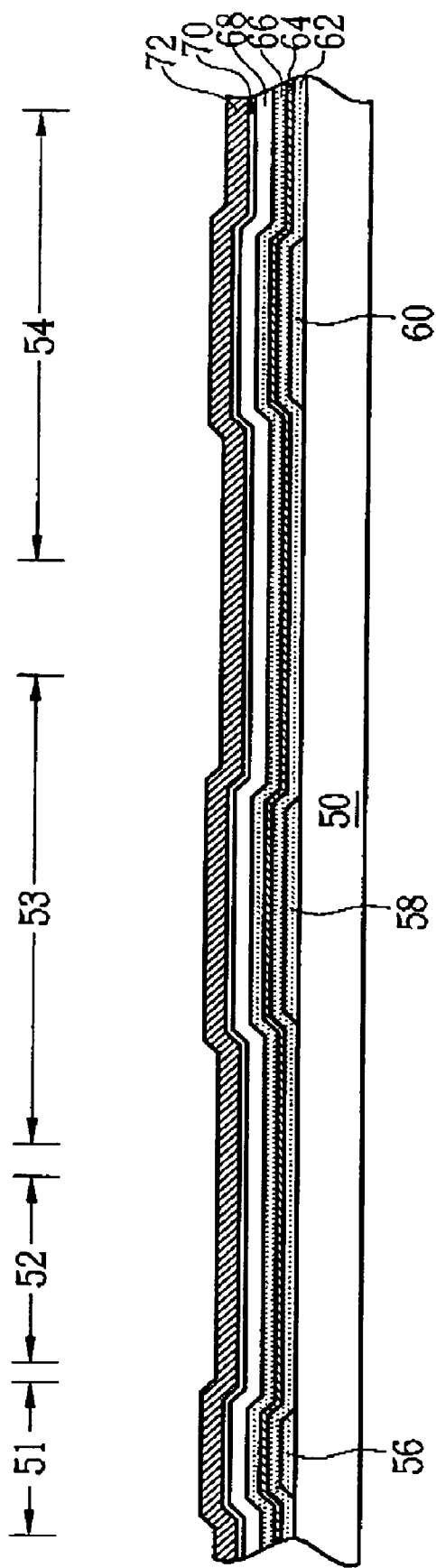
Figure 9:
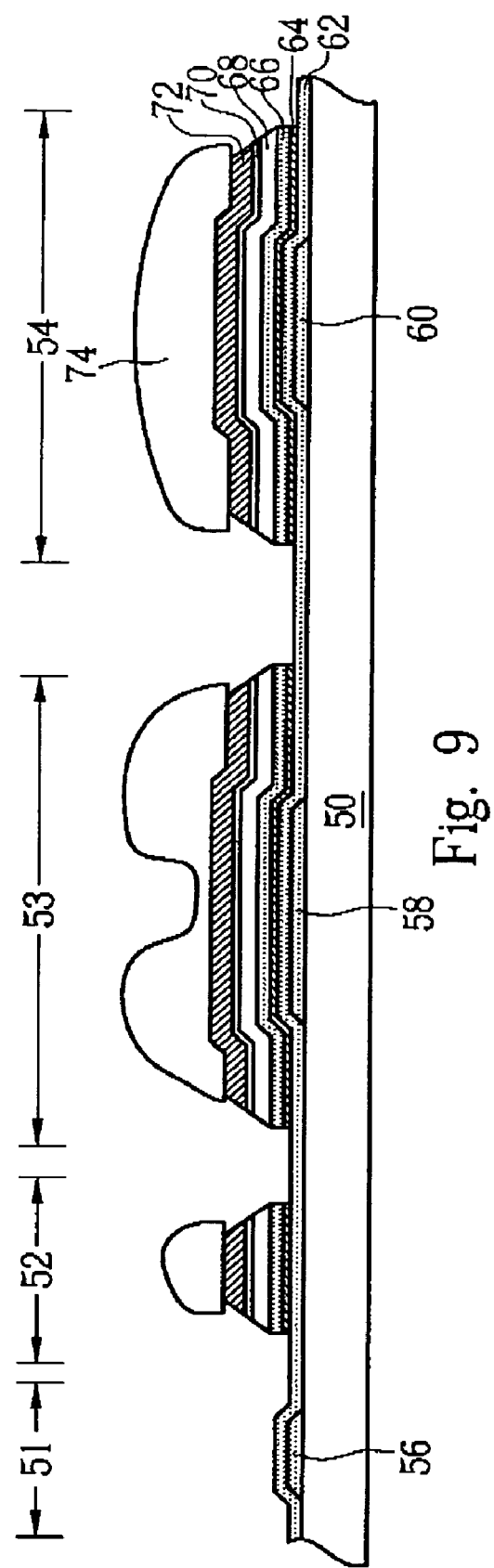

As shown in FIG. 8, a first insulating layer 62, a light shielding layer 64 composed of amorphous silicon or metal for absorbing or blocking light, a second insulating layer 66, a semiconductor layer 68 composed of amorphous silicon or poly-silicon, a doped silicon layer 70 and a second metal layer 72 are sequentially formed on the surface of the substrate 50 covering the patterned first metal layer. Then, as shown in FIG. 9, a photoresist layer 74 is formed on the surface of the substrate 50, and a second photolithography process is performed to define second conductive line 57, the thin film transistor and the capacitor, respectively, in the second conductive line area 52, in the transistor area 53 and in the capacitor area 54. The photoresist layer 74 is then used as a mask to perform an etching process sequentially removing the second metal layer 72, the doped silicon layer 70, the semiconductor layer 68, the second insulating layer 66 and the light shielding layer 64 not covered by the photoresist layer 74 until a surface of the first insulating layer 62 is exposed. Consequently, a second conductive line 57, the thin film transistor and the capacitor are formed, respectively, in the second conductive line area 52, in the transistor area 53 and in the capacitor area 54. Therein, the second metal layer 72 of the capacitor area 54 is a capacitor top electrode. Additionally, no patterns are defined by the photoresist layer 74 in the first conductive line area 51, so the second metal layer 72, the doped silicon layer 70, the semiconductor layer 68, the second insulating layer 66 and the light shielding layer 64 in the first conductive line area 51 are completely removed by the etching process.

Figure 10:
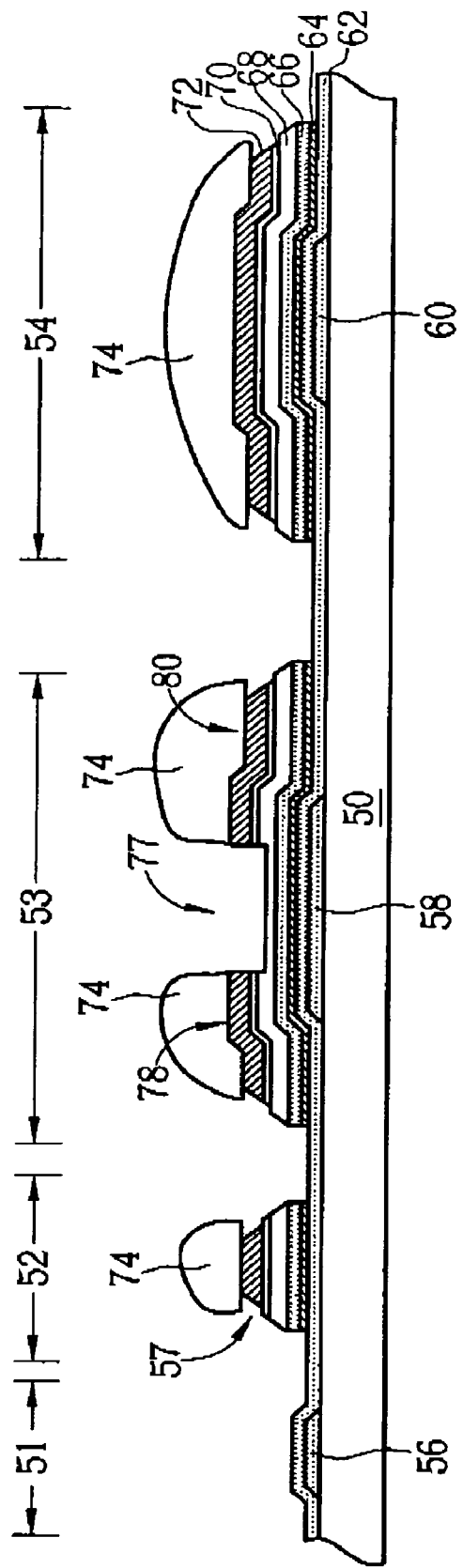

As shown in FIG. 10, an ashing process, for example, is performed to remove a portion of the photoresist layer 74 so as to define a channel area 77 of the thin film transistor. The remaining photoresist layer is used as a mask to perform an etching process or a wet etching process removing the second metal layer 72 and the doped silicon layer 70 within the channel area 77. Consequently, the channel area 77 separates both the second metal layer 72 and the doped silicon layer 70 into two sides, and the two sides of the second metal layer 72 and the doped silicon layer 70 are respectively used as a source electrode 78 and a drain electrode 80 of the thin film transistor. After that, a stripping process is performed to completely remove the remaining photoresist layer.

Figure 11:
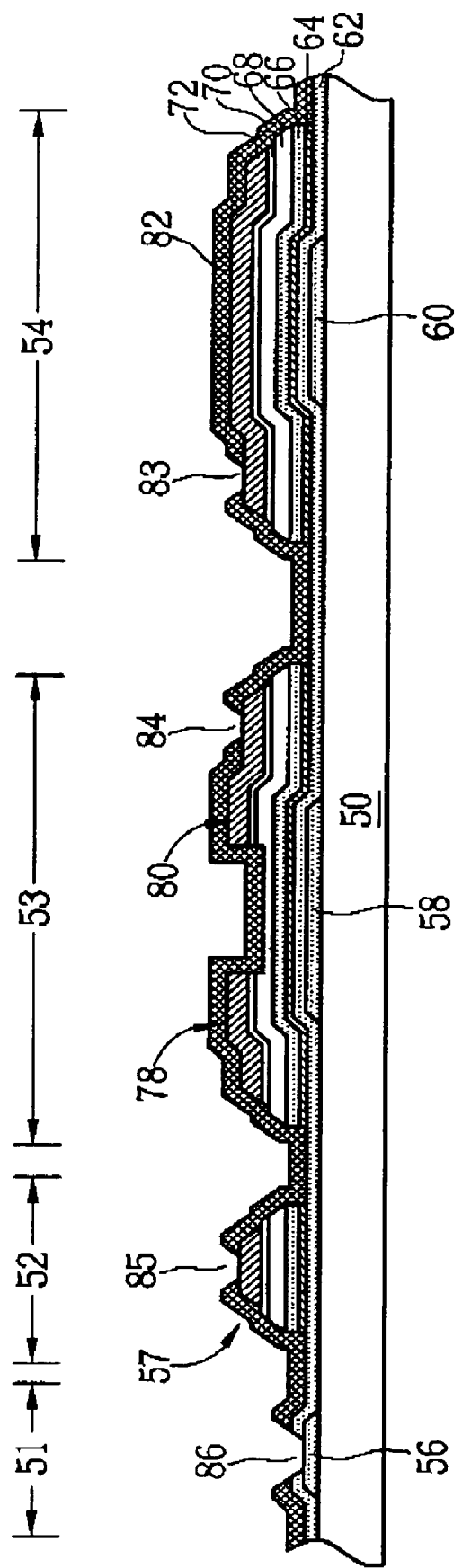
Figure 12:
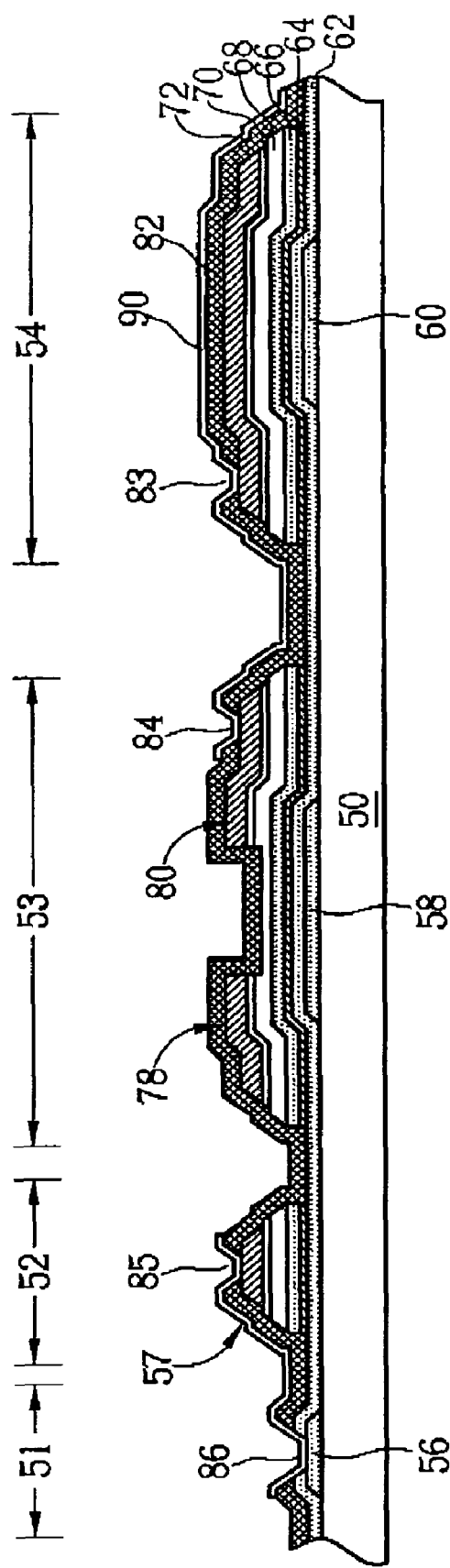

As shown in FIG. 11, a passivation layer 82 is formed on the surface of the substrate 50, and then a third PEP is performed to form a first contact hole 84 in the passivation layer 82 positioned above the drain electrode 80, a second contact hole 83 in the passivation layer 82 positioned above the capacitor top electrode, a third contact hole 85 in the passivation layer 82 positioned above the second conductive line 57 of the second conductive line area 52 and a fourth contact hole 86 in both the passivation layer 82 and the first insulating layer 62 of the first conductive line area 51, respectively. Therefore, a portion of the drain electrode 80, a portion of the capacitor top electrode, a portion of the second conductive line 57 and a portion of the first conductive line 56 are exposed because of the formation of the contact holes 83, 84, 85, 86. Finally, as shown in FIG. 12, a fourth PEP is performed to simultaneously form a patterned transparent conductive layer 90 on a surface of the passivation layer 82 positioned above the drain electrode 80, on a surface of the passivation layer 82 positioned above the capacitor top electrode, on a surface of the passivation layer 82 of the second conductive line area 52 and on a surface of the passivation layer 82 and the first insulating layer 62 of the first conductive line area 51. Furthermore, the transparent conductive layer 90 is electrically connected with the drain electrode 80, the capacitor top electrode, the second conductive line 57 and the first conductive line 56, respectively, through the first contact hole 84, the second contact hole 83, the third contact hole 85 and the fourth contact hole 86.

Additionally, in the second embodiment of the present invention, the light shielding layer 64 is also removed by the dry etching process or the wet etching process while removing the second metal layer 72 and the doped silicon layer within the channel area 77. In the case of using metal as a metal layer as the light shielding layer 64, an etching process using the photoresisit layer 74 as a mask sequentially removes the second metal layer 72, the doped silicon layer 70, the semiconductor layer 68 and the second insulating layer 66 not covered by the photoresist layer 74 until the surface of the light shielding layer 64 is exposed. After performing the ashing process, another etching process is performed to remove the second metal layer 72 and the doped silicon layer 70 within the channel area 77 of the thin film transistor and simultaneously remove the uncovered light shielding layer 64.

Figure 13:
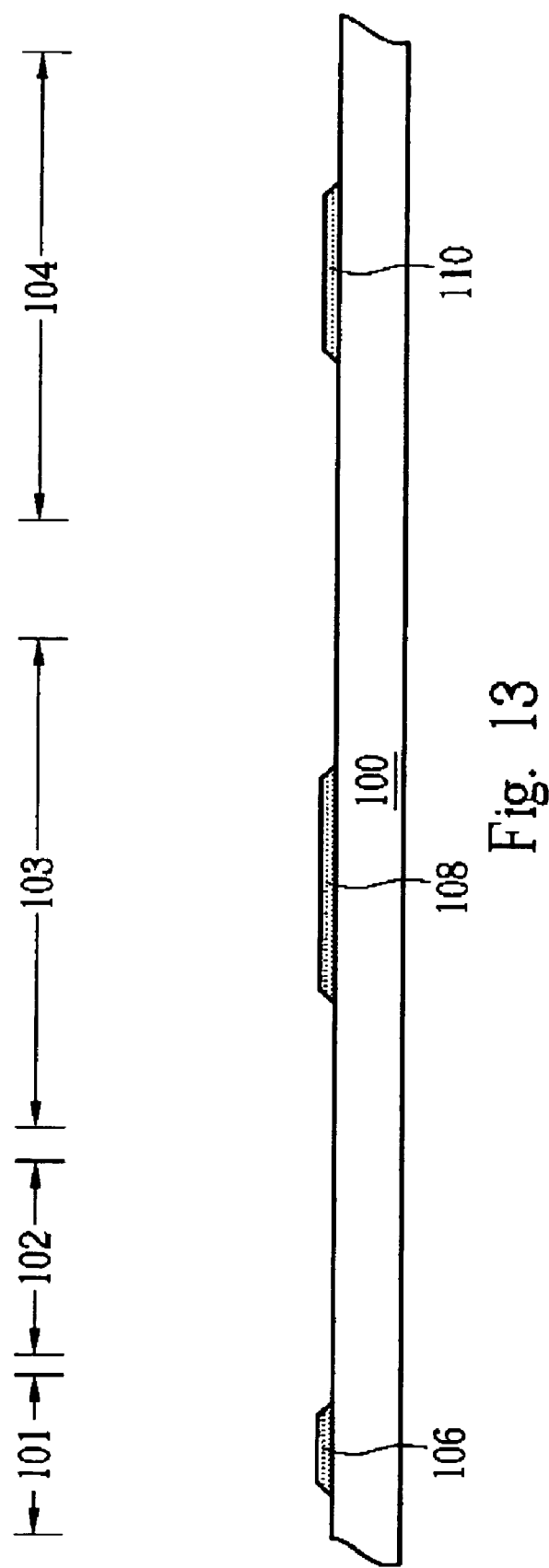
FIG. 13 to FIG. 18 are schematic diagrams of a fabrication process of thin film transistors of a TFT-LCD according to a third embodiment of the present invention.

Please refer to FIG. 13 to FIG. 18 of schematic diagrams of a fabrication process of thin film transistors of a TFT-LCD according to a third embodiment of the present invention. As shown in FIG. 13, the TFT-LCD is fabricated on a surface of a glass substrate 100, and the surface of the substrate 100 comprises a transistor area 103, a capacitor area 104, a first conductive line area 101 and a second conductive line area 102. The process according to the present invention first forms a first metal layer (not shown) on the surface of the substrate 100. A first photolithography process is then performed to define a pattern of the first metal layer in the transistor area 103, and respectively define a capacitor and a first conductive line 106 in the capacitor area 104 and in the first conductive line area 101. After that, an etching process is performed to form a gate electrode 108 of a thin film transistor, a capacitor bottom electrode 110 and a first conductive line 106, respectively, in the transistor area 103, in the capacitor area 104 and in the first conductive line area 101. Simultaneously, the first metal layer in the second conductive line area 102 is removed by the etching process.

Figure 14:
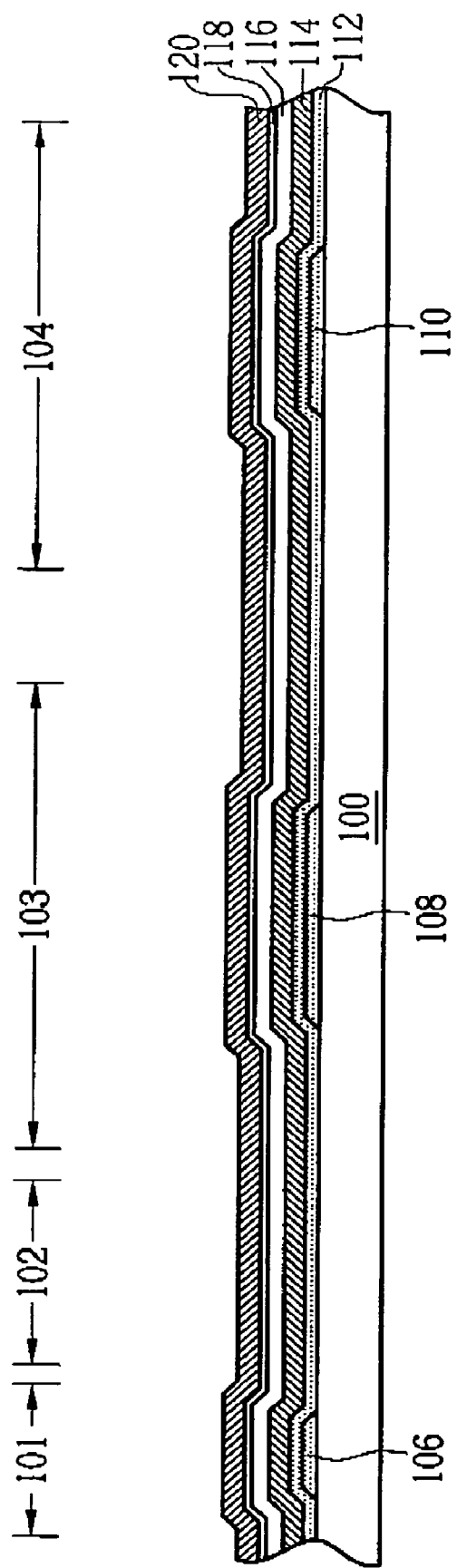
Figure 15:
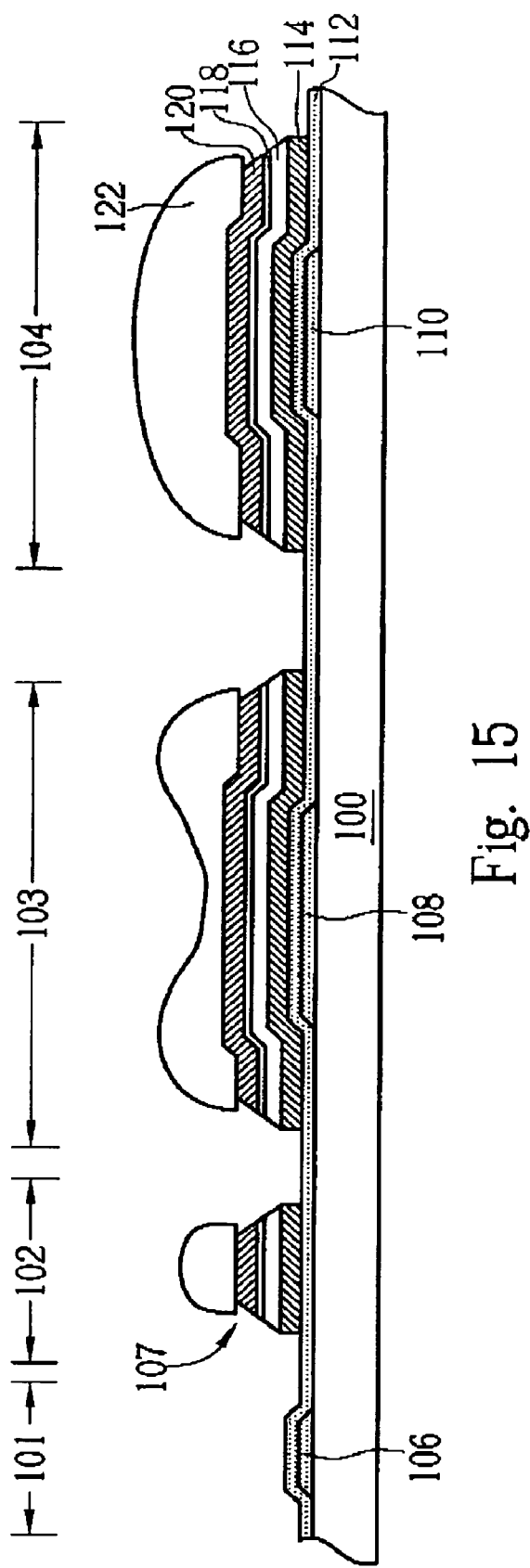

As shown in FIG. 14, a gate insulating layer 112 composed of silicon nitride or silicon oxide having great penetrability, a light absorbing insulating layer 114 composed of organic or inorganic materials such as polyimide and acrylic acid, a semiconductor layer 116 composed of amorphous silicon or poly-silicon, a doped silicon layer 118 and a second metal layer 120 are sequentially formed on the surface of the substrate 100 covering the patterned first metal layer. Then, as shown in FIG. 15, a photoresist layer 122 is formed on the surface of the substrate 100, and a second photolithography process is performed to define a second conductive line 107, the thin film transistor and the capacitor, respectively, in the second conductive line area 102, in the transistor area 103 and in the capacitor area 104. The photoresist layer 122 is then used as a mask to perform an etching process sequentially removing the second metal layer 120, the doped silicon layer 118, the semiconductor layer 116 and the light absorbing insulating layer 114 not covered by the photoresist layer 122 until a surface of die first gate insulating layer 112 is exposed. Consequently, the second conductive line 107, the thin film transistor and the capacitor we formed, respectively, in the second conductive line area 102, in the transistor area 103 and in the capacitor area 104. Therein, the second metal layer 120 of the capacitor area 104 is a capacitor top electrode. Additionally, no patterns are defined by the photoresist layer 122 in the first conductive line area 101, so the second metal layer 120, the doped silicon layer 118, the semiconductor layer 116 and the light absorbing insulating layer 114 in the first conductive line area 101 are completely removed by the etching process.

Figure 16:
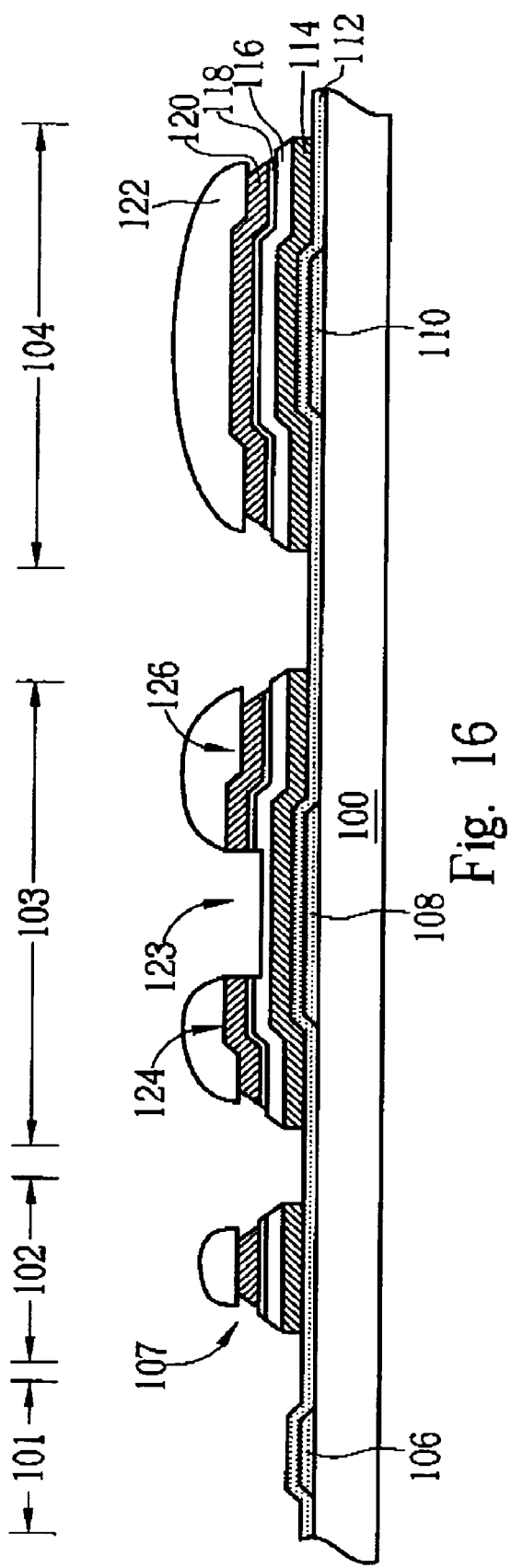

As shown in FIG. 16, an ashing process, for example, is performed to remove a portion of the photoresist layer 122 so as to define a channel area 123 of the thin film transistor. The remaining photoresist layer is used as a mask to perform an etching process or a wet etching process removing the second metal layer 120 and the doped silicon layer 118 within the channel area 123. Consequently, the channel area 123 separates both the second metal layer 120 and the doped silicon layer 118 into two sides, and the two sides of the second metal layer 120 and the doped silicon layer 118 are respectively used as a source electrode 124 and a drain electrode 126 of the thin film transistor. After that, a stripping process is performed to completely remove the remaining photoresist layer.

Figure 17:
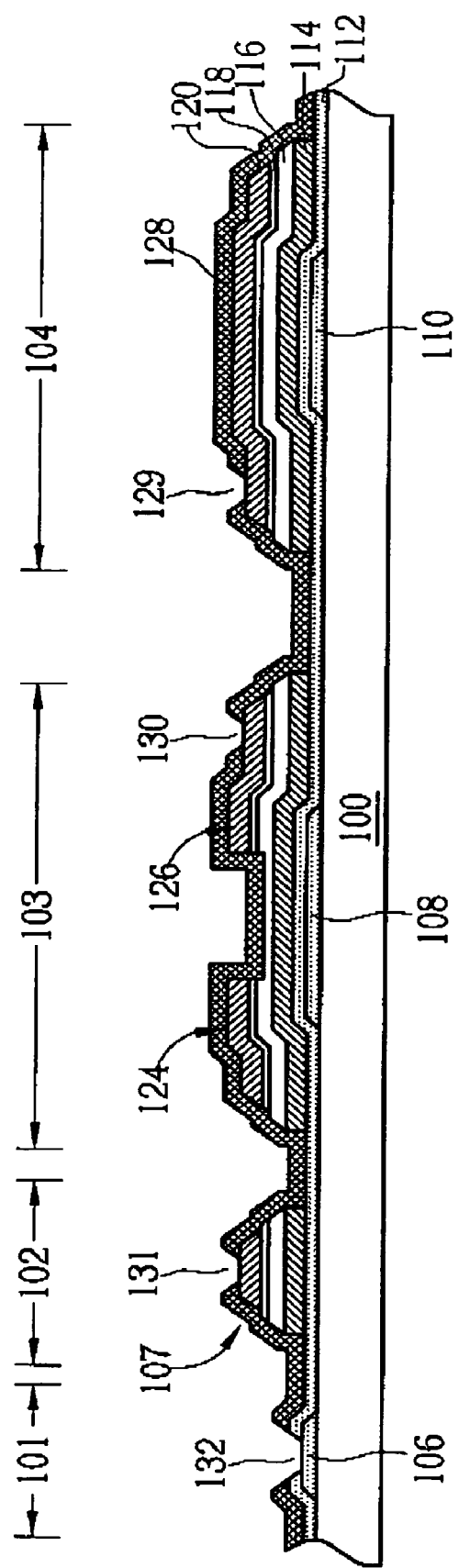
Figure 18:
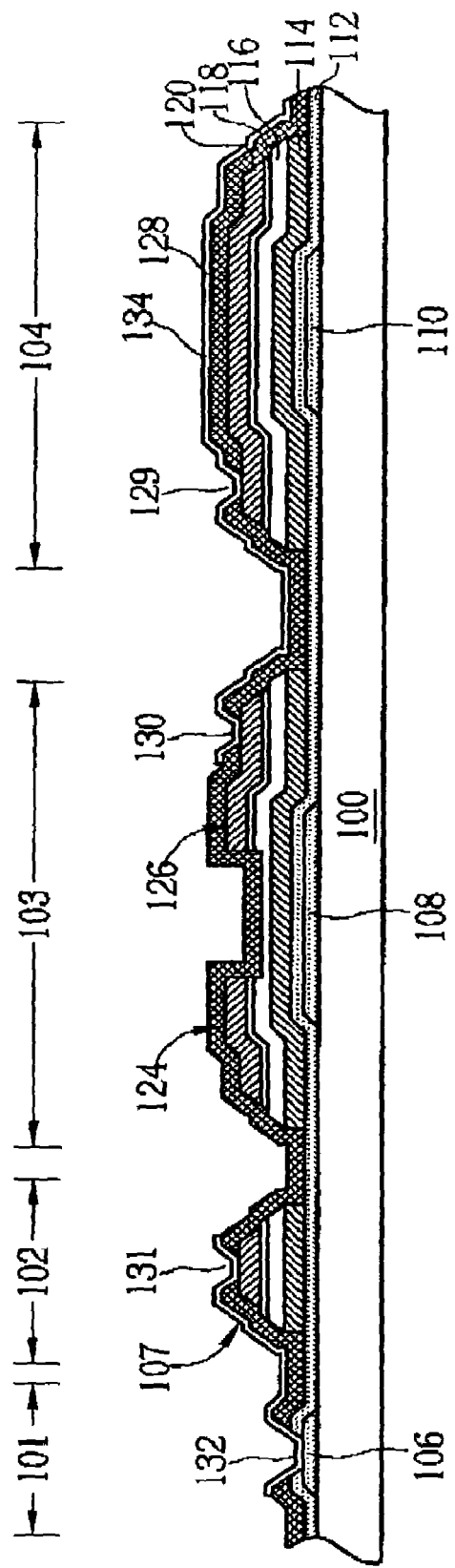

As shown in FIG. 17, a passivation layer 128 is formed on the surface of the substrate 100, and then a third PEP is performed to form a first contact hole 130 in the passivation layer 128 positioned above the drain electrode 126, a second contact hole 129 in the passivation layer 128 positioned above the capacitor top electrode, a third contact hole 131 in the passivation layer 128 positioned above the second conductive line 107 of the second conductive line area 102 and a fourth contact hole 132 in both the passivation layer 128 and the gate insulating layer 112 of the first conductive line area 101, respectively. Therefore, a portion of the drain electrode 126, a portion of the capacitor top electrode, a portion of the second conductive line 107 and a portion of the first conductive line 106 are exposed because of the formation of the contact holes 129, 130, 131, 132. Finally, as shown in FIG. 18, a fourth PEP is performed to simultaneously form a patterned transparent conductive layer 134 on a surface of the passivation layer 128 positioned above the drain electrode 126, on a surface of the passivation layer 128 positioned above the capacitor top electrode, on a surface of the passivation layer 128 of the second conductive line area 102 and on a surface of the passivation layer 128 and the gate insulating layer of the first conductive line area 101. Furthermore, the transparent conductive layer 134 is electrically connected with the drain electrode 126, the capacitor top electrode, the second conductive line 107 and the first conductive line 106, respectively, through the first contact hole 130, the second contact hole 129, the third contact hole 131 and the fourth contact hole According to the first embodiment, the second embodiment and the third embodiment of the present invention, the first conductive line and the second conductive line are respectively used as a data line for transmitting signals and a scan line. Furthermore, the first conductive line and the second conductive line also comprise a plurality of contact pads for electrically connecting with an external driving circuit.

Figure 19:
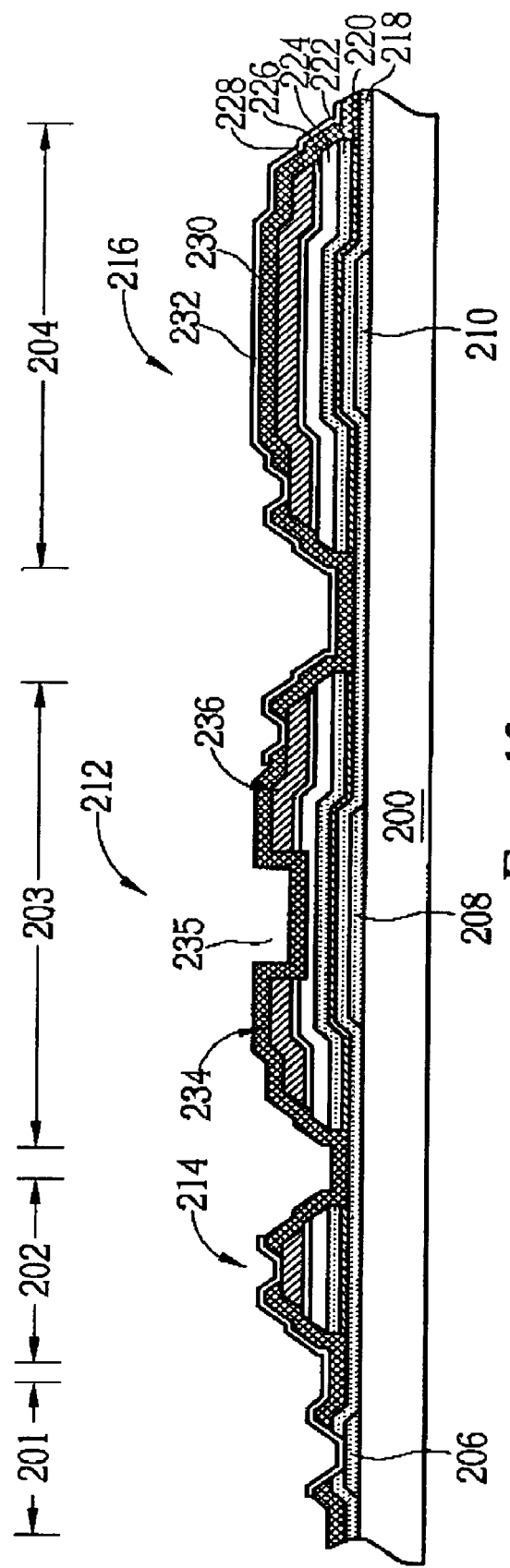
FIG. 19 is a cross-sectional diagram of the TFT-LCD according to the first embodiment and the second embodiment of the present invention.

FIG. 19 is a cross-sectional diagram of the TFT-LCD according to the first embodiment and the second embodiment of the present invention. As shown in FIG. 19, a thin film transistor 212 of the TFT-LCD is fabricated in a transistor area 203 of a substrate 200. The thin film transistor 212 comprises a gate electrode 208 including a first metal layer, a first insulating layer 218, a light shielding layer 220 including amorphous silicon or metal, a second insulating layer 222, a semiconductor layer 224 including amorphous silicon or poly-silicon, a doped silicon layer 226 and a second metal layer 228, therein the light shielding layer 220 is used to block or absorb back light of the TFT-LCD. The thin film transistor 212 also comprises a channel area 235 separating both the second metal layer 228 and the doped silicon layer 226 into two sides, and the two sides of the second metal layer 228 and the doped silicon layer 226 are respectively used as a source electrode 234 and a drain electrode 236 of the thin film transistor 212. Both the second metal layer 228 and the channel area 235 comprise a passivation layer 230 thereon, and the passivation layer 230 positioned above the drain electrode 236 comprises a transparent conductive layer 232 which is electrically connected with the drain electrode 236 though a contact hole.

The TFT-LCD of FIG. 19 further comprises a capacitor 216, a first conductive line 206 and a second conductive line 214 respectively in a capacitor area 204, in a first conductive line area 201 and in a second conductive line area 202 of the substrate 100. The capacitor 216 comprises a bottom electrode 210 including the first metal layer, the first insulating layer 218, the light shielding layer 220, the second insulating layer 222, the semiconductor layer 224, the doped silicon layer 226 and a top electrode including the second metal layer 228. The second conductive line 214 comprises the first insulating layer 218, the light shielding layer 220, the second insulating layer 222, the semiconductor layer 224, the doped silicon layer 226 and the second metal layer 228. The first conductive line 206 is composed of the first metal layer with the first insulating layer 218 formed thereon. Additionally, the capacitor 216, the second conductive line 214 and the first conductive line 206 all comprise a passivation layer 230 and a transparent conductive layer 232 formed thereon. The transparent conductive layer 232 is electrically connected with the capacitor top electrode, the first conductive line 206 and the second conductive line 214 through different contact holes.

Figure 20:
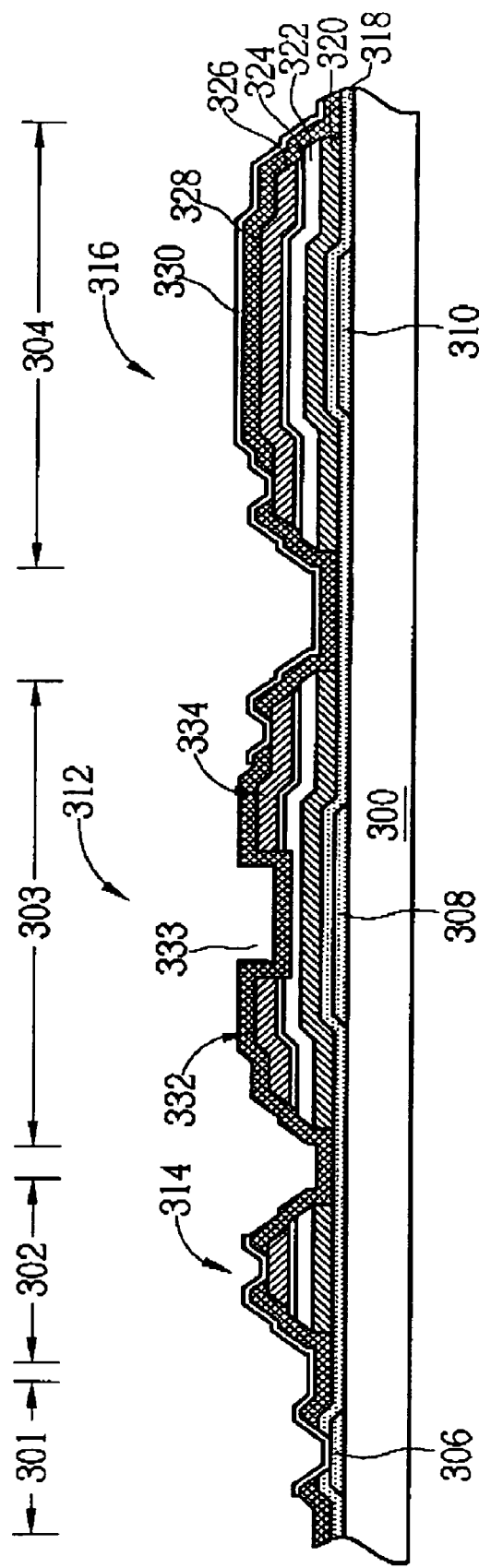
FIG. 20 is a cross-sectional diagram of the TFT-LCD according to the third embodiment of the present invention.

FIG. 20 is a cross-sectional diagram of the TFT-LCD according to the third embodiment of the present invention. As shown in FIG. 20, a thin film transistor 312 of the TFT-LCD is fabricated in a transistor area 303 of a substrate 300. The thin film transistor 312 comprises a gate electrode 308 including a first metal layer, a gate insulating layer 318, a light absorbing insulating layer 320 made of polyimide or acrylic acid, a semiconductor layer 322 including amorphous silicon or poly-silicon, a doped silicon layer 324 and a second metal layer 326, therein the light absorbing insulating layer 320 is used to block or absorb back light of the TFT-LCD. The thin film transistor 312 also comprises a channel area 333 separating both the second metal layer 326 and the doped silicon layer 324 into two sides, and the two sides of the second metal layer 326 and the doped silicon layer 324 are respectively used as a source electrode 332 and a drain electrode 334 of the thin film transistor 312. Both the second metal layer 326 and the channel area 333 comprise a passivation layer 328 thereon, and the passivation layer 328 positioned above the drain electrode 334 comprises a transparent conductive layer 330 which is electrically connected with the drain electrode 334 though a contact hole (not shown).

The TFT-LCD of FIG. 20 further comprises a capacitor 316, a first conductive line 306 and a second conductive line 314 respectively in a capacitor area 304, in a first conductive line area 301 and in a second conductive line area 302 of the substrate 300. The capacitor 316 comprises a bottom electrode 310 including the first metal layer, the gate insulating layer 318, the light absorbing insulating layer 328, the semiconductor layer 322, the doped silicon layer 324 and a top electrode including the second metal layer 326. The second conductive line 314 comprises the gate insulating layer 318, the light absorbing insulating layer 320, the semiconductor layer 322, the doped silicon layer 324 and the second metal layer 326. The first conductive line 306 is composed of the first metal layer with the gate insulating layer 318 formed thereon. Additionally, the capacitor 316, the second conductive line 314 and the first conductive line 306 all comprise a passivation layer 328 and a transparent conductive layer 330 formed thereon. The transparent conductive layer 330 is electrically connected with the capacitor top electrode, the first conductive line 306 and the second conductive line 314 through different contact holes.

In contrast to the prior art fabrication process of a TFT-LCD using 4 PEP, the fabrication process of thin film transistors according to the present invention forms a light shielding layer or a light absorbing insulating layer between the gate electrode and the semiconductor layer of the thin film transistors. Furthermore, the light shielding layer or the light absorbing insulating layer is defined by the second photolithography-etching process (PEP), which is also performed for defining the semiconductor layer, and the light shielding layer or the light absorbing insulating layer is formed under the pattern of the semiconductor layer. In other words, the pattern of the semiconductor layer is almost the same as the pattern of the light shielding layer/the light absorbing insulating layer, therefore, the semiconductor layer is prevented from directly being exposed to back light and the light shielding or the light absorbing insulating layer is used for blocking or absorbing back light of the TFT-LCD. Consequently, the thin film transistors are effectively prevented from producing photo induced leakage current, or photo induced leakage current produced from the thin film transistors are effectively reduced. Additionally, no more than four photolithography-etching processes are performed during the fabrication process according to the present invention, so the present invention still has the advantage of simplification.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A thin film transistor liquid crystal display (TFT-LCD), the TFT-LCD comprising:
    at least one thin film transistor, the thin film transistor comprising:
        a first metal layer of a first pattern being formed in a transistor area on a surface of a substrate;
        a gate insulating layer of a first pattern, a light shielding layer of a first pattern, a semiconductor layer of a first patter, a doped silicon layer of a first pattern and a second metal layer of a first pattern being sequentially stacked on the first metal layer of the first pattern;
        a channel area separating both the second metal layer of the first pattern and the doped silicon layer of the first pattern into two sides respectively used as a source electrode and a drain electrode;
        a passivation layer of a first pattern covering both the second metal layer of the first pattern and the channel area, and a first contact hole being formed in the passivation layer of the first pattern; and
        a transparent conductive layer of a first pattern covering the passivation of the first pattern positioned above the drain electrode, and the transparent conductive layer of the first pattern being electrically connected with the drain electrode through the first contact hole;
    at least one capacitor, the capacitor comprising:
        a first metal layer of a second pattern being formed in a capacitor area on the surface of the substrate;
        a gate insulating layer of a second pattern, a light shielding layer of a second pattern, a semiconductor layer of a second pattern, a doped silicon layer of a second pattern and a second metal layer of a second pattern being sequentially stacked on the first metal layer of the second pattern;
        a passivation layer of a second pattern covering the second metal layer of the second pattern, and a second contact bole being formed in the passivation layer of the second pattern; and
        a transparent conductive layer of a second pattern covering the passivation layer of the second pattern, and the transparent conductive layer of the second pattern being electrically connected with the second metal layer of the second pattern through the second contact hole;
    at least one conductive line, the conductive line comprising:
        a gate insulating layer of a third pattern, a light shielding layer of a third pattern, a semiconductor layer of a third pattern, a doped silicon layer of a third pattern and a second metal layer of a third pattern being sequentially stacked on the surface of the substrate in a conductive line area;
        a passivation layer of a third pattern covering the second metal layer of the third pattern, and a third contact hole being formed in the passivation layer of the third pattern; and
        a transparent conductive layer of a third pattern covering the passivation layer of a third pattern, and the transparent conductive layer of the third pattern being electrically connected with the second metal layer of the third pattern through the third contact hole.

2. The TFT-LCD of claim 1 wherein the first metal layer of a first pattern is used as a gate electrode of the thin film transistor.

3. The TFT-LCD of claim 1 wherein each of the light shielding layers comprises a light absorbing insulating layer.

4. The TFT-LCD of claim 1 wherein each of the light shielding layers comprises a metal layer and an insulating layer.

5. The TFT-LCD of claim 1 wherein the light shielding layer comprises an amorphous silicon layer and an insulating layer.

6. The TFT-LCD of claim 1 wherein the first metal layer of the second pattern is used as a bottom electrode of the capacitor.

7. The TFT-LCD of claim 1 wherein the second metal layer of the second pattern is used as a top electrode of the capacitor.

8. A thin film transistor comprising:
    a patterned first metal layer formed in a transistor area of a substrate;
    a patterned gate insulating layer, a patterned light absorbing insulating layer, a patterned semiconductor layer, a patterned doped silicon layer, and a patterned second metal layer sequentially stacked on a surface of the patterned first metal layer; and
    a channel area separating the patterned second metal layer and the patterned doped silicon layer so as to respectively form a source electrode and a drain electrode.

9. The thin film transistor of claim 8, wherein a pattern of the patterned light absorbing insulating layer is substantially the same as a pattern of the patterned semiconductor layer.

10. A thin film transistor comprising:
    a patterned first metal layer formed in a transistor area of a substrate;
    a patterned first insulating layer, a patterned light shielding layer, a patterned second insulating layer, a patterned semiconductor layer, a patterned doped silicon layer, and a patterned second metal layer sequentially stacked on a surface of the patterned first metal layer, a pattern of the patterned light shielding layer being substantially the same as a pattern of the patterned semiconductor layer, and the light shielding layer being formed of a metal layer; and
    a channel area separating the patterned second metal layer and the patterned doped silicon layer so as to respectively form a source electrode and a drain electrode.

* * * * *